(12) United States Patent
Bolton et al.

(10) Patent No.: US 10,498,327 B2
(45) Date of Patent: Dec. 3, 2019

(54) OVERVOLTAGE DETECTOR FOR AN RF SWITCH

(71) Applicant: Qorvo US, Inc., Greensboro, NC (US)

(72) Inventors: Eric K. Bolton, Kernersville, NC (US); Daniel Charles Kerr, Oak Ridge, NC (US); Christian Rye Iversen, Vestbjerg (DK); Robert Andrew Phelps, Greensboro, NC (US)

(73) Assignee: Qorvo US, Inc., Greensboro, NC (US)

( * ) Notice: Subject to any disclaimer, the term of this patent is extended or adjusted under 35 U.S.C. 154(b) by 651 days.

(21) Appl. No.: 15/292,650

(22) Filed: Oct. 13, 2016

(65) Prior Publication Data

US 2017/0244402 A1 Aug. 24, 2017

Related U.S. Application Data

(60) Provisional application No. 62/297,465, filed on Feb. 19, 2016.

(51) Int. Cl.
*H03K 17/082* (2006.01)
*H02M 3/07* (2006.01)
*H03K 17/693* (2006.01)

(52) U.S. Cl.
CPC ....... *H03K 17/0822* (2013.01); *H03K 17/693* (2013.01)

(58) Field of Classification Search
CPC ........ G01R 19/16571; G01R 19/16576; G05F 1/565; G05F 1/575; H01J 37/32082; H01J 37/32174; H01J 37/32183; H01L 28/20; H01L 29/0611; H02H 9/046; H02M 3/33569; H03F 2200/18; H03F 2200/411; H03F 2200/451; H03F 2203/21131; H03F 2203/21139; H03G 3/3042; H03H 11/28; H03H 11/30; H03H 7/0123; H03H 7/38; H03H 7/40; H03K 17/08104; H03K 17/0822; H03K 17/102; H03K 17/122; H03K 17/687; H03K 17/6872; H03K 17/693; H03K 2017/6875; H04B 1/40; (Continued)

(56) References Cited

U.S. PATENT DOCUMENTS 6,272,327 B1 * 8/2001 Kurchuk ................ H04B 1/109 455/217
6,999,327 B2 * 2/2006 Smith ................ G06K 19/0713 363/60

(Continued)

*Primary Examiner* — Thienvu V Tran
*Assistant Examiner* — Nicolas Bellido
(74) *Attorney, Agent, or Firm* — Withrow & Terranova, P.L.L.C.

(57) ABSTRACT

An overvoltage detector for an RF switch is disclosed. The overvoltage detector is made up of circuitry having a detector output that couples to a controller, a body voltage input that couples to a charge pump, and a body voltage output that couples to a body terminal of the RF switch. The overvoltage detector is configured to detect an overvoltage across the RF switch by monitoring body leakage current flowing between the body voltage input and the body voltage output. Upon detecting body leakage current over a predetermined level, the overvoltage detector generates an overvoltage signal at the detector output to indicate an overvoltage across the RF switch.

21 Claims, 3 Drawing Sheets

(58) Field of Classification Search
CPC ....... H04B 1/44; H04B 1/48; Y10T 29/49105; Y10T 307/406
See application file for complete search history.

(56) References Cited

U.S. PATENT DOCUMENTS

| | | | | |
|---|---|---|---|---|
| 2013/0307576 | A1* | 11/2013 | Ilkov | G01R 31/2822 324/762.02 |
| 2014/0063666 | A1* | 3/2014 | Kallal | H02J 7/0029 361/56 |
| 2016/0241234 | A1* | 8/2016 | Mavretic | G01R 19/165 |
| 2018/0204101 | A1* | 7/2018 | De Jongh | G06K 19/0725 |

* cited by examiner

| INPUT POWER (dBm) AT DETECTION | SENSITIVITY SETTING |
|---|---|
| 38.7 | 0 |
| 40.5 | 1 |
| 41.5 | 2 |
| 42.1 | 3 |
| 42.5 | 4 |
| 42.9 | 5 |
| 43.3 | 6 |
| 43.6 | 7 |
| 43.9 | 8-15 |

FIG. 4

OVERVOLTAGE DETECTOR FOR AN RF SWITCH

RELATED APPLICATIONS

This application claims the benefit of provisional patent application Ser. No. 62/297,465, filed Feb. 19, 2016, the disclosure of which is hereby incorporated herein by reference in its entirety.

FIELD OF THE DISCLOSURE

The present disclosure relates to protecting radio frequency (RF) switches from damage during overvoltage events.

BACKGROUND

Performance for an RF switch is generally judged based on a lowest figure of merit (FOM) achievable without degrading a drain-to-source breakdown voltage (BVDSS) of any individual transistor within a stack of transistors making up the RF switch. The FOM of a single transistor is the transistor's on-state drain-to-source resistance ($R_{ON}$) multiplied by the transistor's off-state capacitance ($C_{OFF}$). Modern silicon-on-insulator (SOI) antenna tuners include high power RF switches that are exposed to overvoltage events that occur when the antenna tuner is operating at maximum efficiency. Operating RF switches slightly above a soft breakdown voltage is not catastrophic but should be avoided to prevent accelerated degradation of the RF switch. Thus, there is a need for a need for an overvoltage detector for an RF switch.

SUMMARY

An overvoltage detector for an RF switch is disclosed. The overvoltage detector is made up of circuitry having a detector output that couples to a controller, a body voltage input that couples to a charge pump, and a body voltage output that couples to a body terminal of the RF switch. The overvoltage detector is configured to detect an overvoltage across the RF switch by monitoring body leakage current flowing between the body voltage input and the body voltage output. Upon detecting body leakage current over a predetermined level, the overvoltage detector generates an overvoltage signal at the detector output to indicate an overvoltage across the RF switch.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 4 is a table of input power at overvoltage detection versus various sensitivity settings used as a predetermined set point to trigger overvoltage detection.

DETAILED DESCRIPTION

Figure 1:
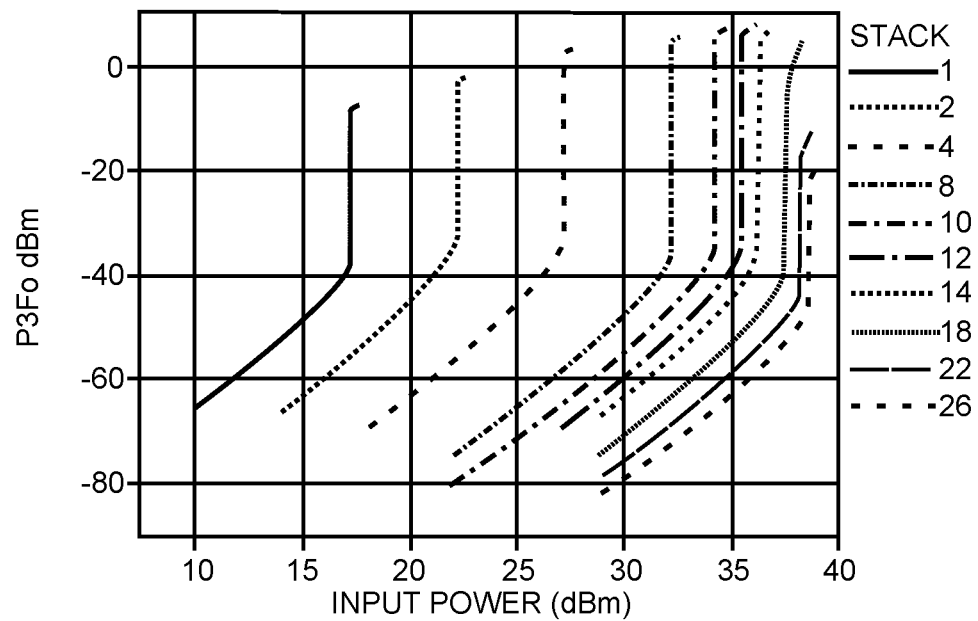
FIG. 1 is a graph of third harmonic power versus input power for sample RF switches having a different number of stacked transistors with each of the RF switches being tested until a soft breakdown occurs.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 is a graph of third harmonic power versus input power for sample radio frequency (RF) switches having a different number of series coupled transistors within a transistor stack. Each RF switch was tested until a soft breakdown occurred. A legend along the right side of the graph assigns a dashed line for the sample RF switches. A leftmost trace drawn in solid line within the graph represents a soft breakdown of a single field effect transistor (FET). Remaining traces progressing from left to right represent soft breakdowns of RF switches having increasing numbers of FETs within their respective transistor stack. Notice that each RF switch sample has a steady increase in third harmonic power (P3Fo) until soft breakdown occurs.

Figure 2:
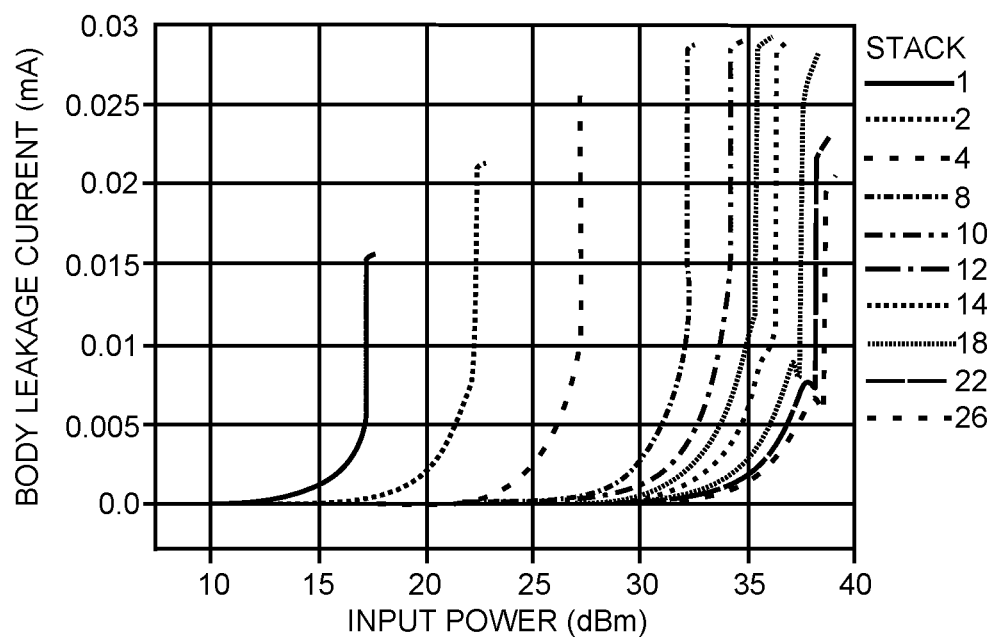
FIG. 2 is a graph of body leakage current versus input power for the sample RF switches with each of the RF switches being tested until a soft breakdown occurs.

FIG. 2 is a graph of body leakage current $I_{LEAK}$ versus input power for the sample RF switches represented in FIG. 1. A legend along the right side of the graph assigns a dashed line for the sample RF switches. A leftmost trace drawn in solid line within the graph represents a soft breakdown of a single FET. Remaining traces progressing from left to right represent soft breakdowns of RF switches having increasing numbers of FETs within their respective transistor stack. Note that each RF switch sample has a steady increase in body leakage current $I_{LEAK}$ until soft breakdown occurs. After soft breakdown occurs, body leakage current abruptly increases relatively steeply. A detection of overvoltage across an RF switch should occur before body leakage current $I_{LEAK}$ passes a knee that is between the steady increase in body leakage current and the abrupt increase in body leakage current.

Figure 3:
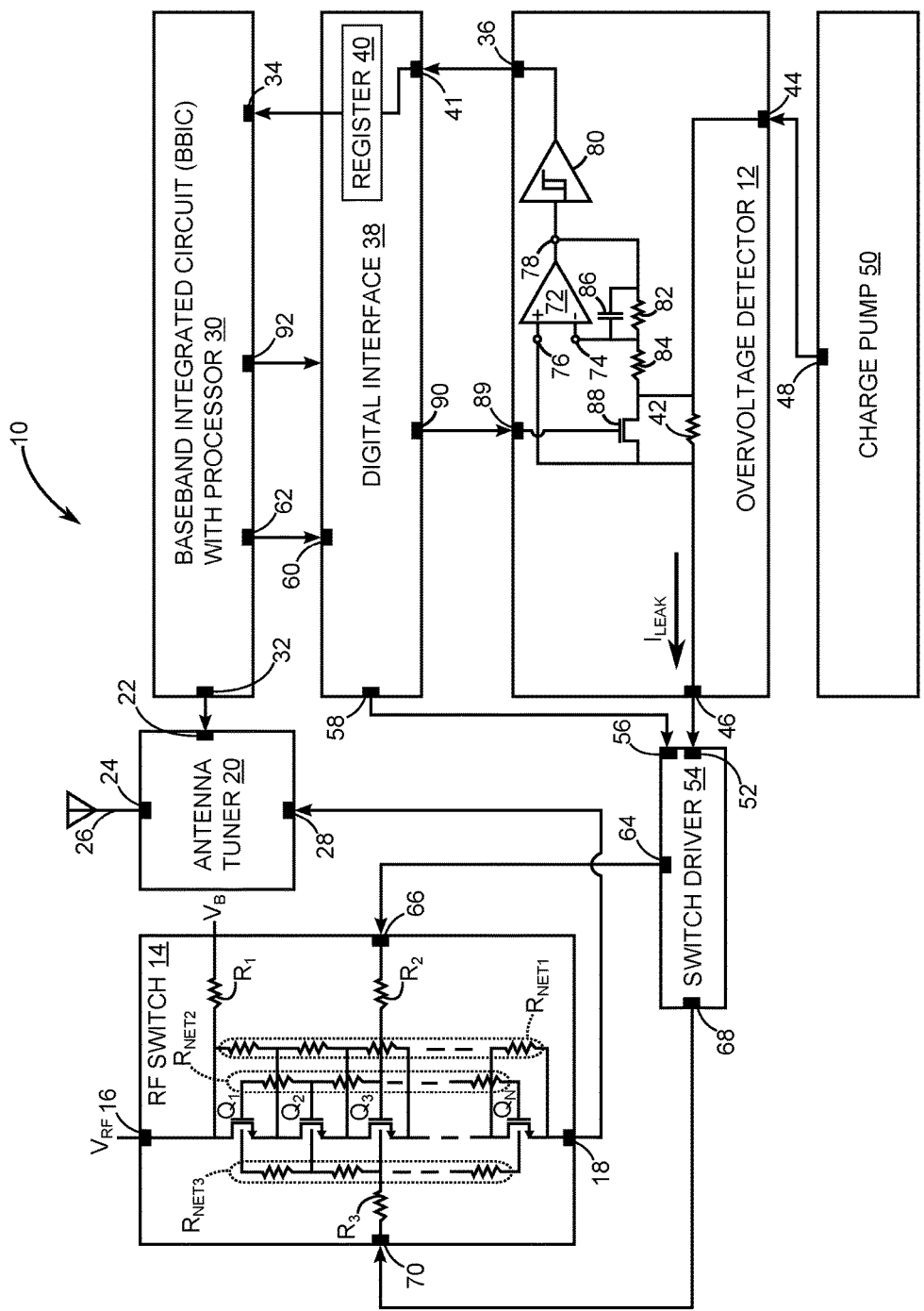
FIG. 3 is a schematic of an exemplary system that includes an overvoltage detector for an RF switch.

FIG. 3 is a schematic of an exemplary system 10 that includes an overvoltage detector 12 for an RF switch 14 that has a first switch port 16 and a second switch port 18. In greater detail, the RF switch 14 is made up of FETs $Q_1$-$Q_N$ that are stacked in series between the first switch port 16 and the second switch port 18, wherein N is a finite positive integer. A first resistor network $R_{NET1}$ includes a resistor coupled across the drain and source of each of the FETs $Q_1$-$Q_N$ to provide improved breakdown reliability and improved linearity. The first resistor network is coupled to a bias voltage $V_B$ through a first resistor $R_1$. A second resistor network $R_{NET2}$ is a gate biasing network, whereas a third resistor network $R_{NET3}$ is a body bias network for the FETs $Q_1$-$Q_N$. The second resistor network $R_{NET2}$ is fed a gate drive signal through a second resistor $R_2$, and the third resistor network is fed a body drive signal through a third resistor $R_3$.

The overvoltage detector 12 is employed within the system 10 to protect the RF switch 14 from an overvoltage. In this particular exemplary embodiment, the system 10 includes an antenna tuner 20 with a tuning input 22, an antenna port 24 coupled to an antenna 26, and an RF signal port 28 coupled to the second switch port 18 of the RF switch 14.

A processor 30 has a tuning output 32 coupled to the tuning input 22 of the antenna tuner 20. The processor 30 also has a detector input 34 coupled to a detector output 36 of the overvoltage detector 12. In this exemplary embodiment, the detector input 34 is coupled to the detector output 36 through a digital interface 38 that includes a register 40 and a register input 41 that captures the status of a detector signal by first clearing an overvoltage flag bit of the register and then setting the overvoltage flag bit when an overvoltage event occurs. The flag bit is read by the processor 30 by way of the detector input 34. It is to be understood that additional circuit elements such as filters and buffers can be placed between the detector output 36 and the register 40 to condition and capture the detector signal. The processor 30 is typically integrated within a baseband integrated circuit (BBIC).

The overvoltage detector 12 includes a current sense resistor 42 coupled between a body voltage input 44 and a body voltage output 46. Body leakage current $I_{LEAK}$ flows through the current sense resistor 42 when the overvoltage detector 12 is actively monitoring for overvoltage events. In an exemplary embodiment, the current sense resistor 42 has a resistance between about 20,000 Ohms and 60,000 Ohms. The body voltage input 44 is coupled to a pump voltage output 48 of a charge pump 50. The body voltage output 46 is coupled to a drive voltage input 52 of a switch driver 54, which in turn has a switch control input 56 coupled to a switch control output 58 of the digital interface 38. The processor 30 generates a switch control signal that is conditioned through the digital interface 38 before passing through the switch control output 58. A switch state input 60 of the digital interface 38 is coupled to a switch change output 62 of the processor 30 to pass the switch control signal from the processor 30 to the digital interface 38. The switch driver 54 also includes a gate drive output 64 coupled to a gate input 66 of the RF switch 14, and a body drive output 68 coupled to a body terminal 70 of the RF switch 14.

The overvoltage detector 12 further includes a voltage comparator 72 having a first comparator input 74 coupled to the body voltage input 44 and a second comparator input 76 coupled to the body voltage output 46, and a comparator output 78 coupled to the detector output 36. It is to be understood that the voltage comparator 72 can be an operational amplifier configured as a voltage comparator without deviating from the scope of the present disclosure. Moreover, in the exemplary embodiment of FIG. 3, the first comparator input 74 is an inverting input and the second comparator input 76 is a non-inverting input.

In this exemplary embodiment, a Schmitt trigger buffer 80 is coupled between the comparator output 78 and the detector output 36. The voltage comparator 72 is configured to generate an overvoltage signal at the detector output 36 when a voltage difference between the first comparator input 74 and the second comparator input 76 exceeds a predetermined voltage level set to correspond to body leakage current $I_{LEAK}$ exceeding a predetermined current level. The overvoltage signal can be a logic state transition of a bit, a byte, or an analog indicator and/or combinations thereof.

The predetermined voltage level is set by the ratio of a first reference resistor 82 and a second reference resistor 84. The first reference resistor 82 is coupled between the first comparator input 74 and the comparator output 78. The second reference resistor 84 is coupled between the first comparator input 74 and the body voltage input 44. In one embodiment, a ratio of the first reference resistor 82 to the second reference resistor 84 sets the predetermined voltage level to about 50 millivolts. In an exemplary embodiment, the first reference resistor 82 has a resistance value of 300,000 Ohms, and the second reference resistor 84 has a resistance value of 27,000 Ohms.

A filter capacitor 86 is coupled across the first reference resistor 82 to filter closed loop feedback between the comparator output 78 and the first comparator input 74. An exemplary capacitance value for the filter capacitor 86 is around 1 picofarad (pF).

During switching transitions between ON and OFF, an inrush of current flowing through the current sense resistor 42 could lead to false overvoltage detection. To prevent false overvoltage detection during switching transitions, a shorting switch 88 is coupled across the current sense resistor 42. The shorting switch 88 is typically a small FET that is turned on and off by a detector control signal provided to a switch control input 89 through a detector control output 90 included with the digital interface 38. When the shorting switch 88 is turned on, current that normally flows through the current sense resistor 42 will be shunted through the shorting switch 88. When the shorting switch 88 is off, body leakage current $I_{LEAK}$ flows through the current sense resistor 42 and the overvoltage detector 12 is thus made ready to detect overvoltage events. In an exemplary embodiment, the detector control signal is generated internally by the digital interface 38 in response to a detected overvoltage as well as by the processor 30 through a detector reset output 92 in response to a desired reset condition such as brought about by a switching transition.

FIG. 4 is a table of input power at overvoltage detection versus various sensitivity settings used as a predetermined digital set point to trigger overvoltage detection. The sensitivity settings are realized by way of the current sense resistor 42 (FIG. 3) that has a digitally controlled resistance value. In an exemplary embodiment used to determine the entries in the table of FIG. 4, the digitally controlled resistance value is a 3-bit value. Using the 3-bit value 0-15, sensitivity can be set for body leakage currents $I_{LEAK}$ that are between about 2.5 µA and 20 µA. The sensitivity is typically just set once for a particular RF switch such as the RF switch 14. Overvoltage conditions will be different for different models and type of RF switches. Therefore, the sensitivity setting allows the overvoltage detector 12 to be used to detect overvoltage levels for particular RF switch models and types, which makes the overvoltage detector 12 flexible for implementation in various applications.

In operation of system 10, a reset initiated by the processor 30 will cause the detector control signal to close the shorting switch 88 during a switching transition. The processor 30 then sends a signal through the switch control output 58 to turn the RF switch 14 on while the charge pump 50 is generating a turn-on voltage that is applied through the switch driver 54 to the gate input 66. The switch driver 54 also applies an appropriate turn-on voltage level such as zero volts to the body terminal 70. While the RF switch 14 is on, RF signals ($V_{RF}$) can pass between the first switch port 16 and the second switch port 18 to and from the antenna 26 through the antenna tuner 20. At this time, the processor 30 can tune the antenna tuner 20 such that RF signals pass to and from the antenna 26 with maximum efficiency.

At some point it is desirable to turn the RF switch 14 off. The processor 30 commands the shorting switch 88 to open so that body leakage current $I_{LEAK}$ can flow through the current sense resistor 42, thereby making the overvoltage detector 12 active. To turn the RF switch 14 off, the processor 30 sends an OFF signal through the switch control output 58 while the charge pump 50 is generating a voltage such as −2.5 V that is applied through the switch driver 54 to the body terminal 70. The switch driver 54 also applies an appropriate voltage level to the gate input 66 to turn the RF switch 14 off. During this OFF period, RF signals are blocked from passing between the first switch port 16 and the second switch port 18. However, while the RF switch 14 is OFF, unpredictable and potentially damaging overvoltage can begin to develop across the RF switch 14. As a result, body leakage current $I_{LEAK}$ will increase through the current sense resistor 42 thereby increasing a voltage difference between the first comparator input 74 and the second comparator input 76. Once the voltage difference between the first comparator input 74 and the second comparator input 76 exceeds a predetermined voltage level set to correspond to body leakage current $I_{LEAK}$ exceeding a predetermined current level, the logic state at the detector output 36 is transitioned by the voltage comparator 72 to signify an overvoltage condition. The register 40 in the digital interface 38 captures the transitioned logic state in a flag bit. The processor 30 detects the logic state by reading the flag bit. Once the processor 30 determines that an overvoltage event is beginning to occur, the processor 30 will detune the antenna tuner 20 to reduce the potential for overvoltage across the RF switch 14. It is to be understood that the system 10 is just one example of how the overvoltage detector 12 can be employed within a system to prevent an overvoltage event from damaging the RF switch 14.

Those skilled in the art will recognize improvements and modifications to the preferred embodiments of the present disclosure. All such improvements and modifications are considered within the scope of the concepts disclosed herein and the claims that follow.

What is claimed is:

1. An overvoltage detector for an RF switch comprising circuitry having a detector output that couples to a controller, a body voltage input that couples to a charge pump, and a body voltage output that couples to a body terminal of the RF switch, wherein the circuitry is configured to detect an overvoltage across the RF switch by monitoring body leakage current flowing between the body voltage input and the body voltage output, and upon detecting body leakage current over a predetermined current level, generate an overvoltage signal at the detector output to indicate the overvoltage across the RF switch.

2. The overvoltage detector for the RF switch of claim 1 wherein the circuitry comprises:
a current sense resistor coupled between the body voltage input and the body voltage output; and
a voltage comparator having a first comparator input coupled to the body voltage input and a second comparator input coupled to the body voltage output, and a comparator output coupled to the detector output, wherein the voltage comparator is configured to generate the overvoltage signal at the detector output when a voltage difference between the first comparator input and the second comparator input exceeds a predetermined voltage level that is set to correspond to body leakage current that exceeds the predetermined current level.

3. The overvoltage detector for the RF switch of claim 2 wherein the circuitry further includes a Schmitt trigger buffer coupled between the comparator output and the detector output.

4. The overvoltage detector for the RF switch of claim 2 further comprising a shorting switch coupled across the current sense resistor, wherein the shorting switch is configured to close upon overvoltage detection.

5. The overvoltage detector for the RF switch of claim 4 wherein the shorting switch is further configured to close when the RF switch is transitioning between an off-state and an on-state.

6. The overvoltage detector for the RF switch of claim 2 wherein the circuitry further includes a reference resistor coupled between the comparator output, the first comparator input, and the body voltage input to set the predetermined voltage level.

7. The overvoltage detector for the RF switch of claim 2 wherein the current sense resistor has a digitally programmable resistance value.

8. An overvoltage detector for an RF switch comprising:
a detector output that couples to a controller;
a body voltage input that couples to a charge pump, and a body voltage output that couples to a body terminal of the RF switch;
a current sense resistor coupled between the body voltage input and the body voltage output; and
a voltage comparator having a first comparator input coupled to the body voltage input and a second comparator input coupled to the body voltage output, and a comparator output coupled to the detector output, wherein the voltage comparator is configured to generate an overvoltage signal at the detector output to indicate an overvoltage condition across the RF switch when a voltage difference between the first comparator input and the second comparator input exceeds a predetermined voltage level as body leakage current exceeds a predetermined current level.

9. The overvoltage detector for the RF switch of claim 8 further including a Schmitt trigger buffer coupled between the comparator output and the detector output.

10. The overvoltage detector for the RF switch of claim 8 further comprising a shorting switch coupled across the current sense resistor, wherein the shorting switch is configured to close upon overvoltage detection.

11. The overvoltage detector for the RF switch of claim 10 wherein the shorting switch is further configured to close when the RF switch is transitioning between an off-state and an on-state.

12. The overvoltage detector for the RF switch of claim 8 further including a reference resistor coupled between the comparator output, the first comparator input, and the body voltage input to set the predetermined voltage level.

13. The overvoltage detector for the RF switch of claim 8 wherein the current sense resistor has a digitally programmable resistance value.

14. A method of detecting an overvoltage on an RF switch comprising:
providing an overvoltage detector having a detector output that couples to a controller, a body voltage input that couples to a charge pump, and a body voltage output that couples to a body terminal of the RF switch;
detecting with the overvoltage detector an overvoltage across the RF switch by monitoring body leakage current flowing between the body voltage input and the body voltage output; and
generating an overvoltage signal at the detector output upon detecting body leakage current over a predetermined current level to indicate an overvoltage across the RF switch.

15. The method of detecting an overvoltage on the RF switch of claim 14 wherein the overvoltage detector includes a current sense resistor coupled between the body voltage input and the body voltage output and further including a shorting transistor coupled across the current sense resistor.

16. The method of detecting an overvoltage on the RF switch of claim 15 further comprising turning the shorting transistor on by way of an ON signal, thereby diverting body leakage current around the current sense resistor upon the overvoltage detector detecting an overvoltage on the RF switch.

17. The method of detecting an overvoltage on the RF switch of claim 16 further comprising turning the shorting transistor OFF by way of an OFF signal, thereby forcing body leakage current through the current sense resistor upon the shorting transistor receiving an OFF signal.

18. The method of detecting an overvoltage on the RF switch of claim 15 further comprising turning the shorting transistor ON by way of an ON signal, thereby diverting body leakage current around the current sense resistor upon the overvoltage detector receiving an RF switch transitioning signal.

19. The method of detecting an overvoltage on the RF switch of claim 15 wherein the current sense resistor has a digitally programmable resistance value.

20. The method of detecting an overvoltage on the RF switch of claim 19 further comprising changing the digitally programmable resistance value upon receiving a digital value indicative of a resistance value to be changed to.

21. A method for protecting an RF switch from an overvoltage comprising:
providing an antenna tuner with a tuning input and having an RF signal input coupled to a switch port of the RF switch;
providing an overvoltage detector with a detector output, a body voltage input that couples to a charge pump, and a body voltage output that couples to a body terminal of the RF switch;
providing a processor having a detector input coupled to the detector output and a tuning output coupled the tuning input of the antenna tuner;
detecting an overvoltage across the RF switch by monitoring body leakage current flowing between the body voltage input and the body voltage output; and
generating an overvoltage signal at the detector output upon detecting body leakage current over a predetermined current level to indicate an overvoltage across the RF switch; and
tuning the antenna tuner by way of the processor to reduce overvoltage on the RF switch upon the processor determining that the overvoltage signal has been generated.

* * * * *